United States Patent

Klanatsky

[15] 3,671,879

[45] June 20, 1972

[54] TRANSISTOR PROTECTION CIRCUIT

[72] Inventor: John J. Klanatsky, New York, N.Y.

[73] Assignee: Emerson Electric Co., St. Louis, Mo.

[22] Filed: Nov. 9, 1970

[21] Appl. No.: 87,923

[52] U.S. Cl. ............................330/207 P, 330/15, 330/17, 330/20, 330/24

[51] Int. Cl. ............................H03y 21/00

[58] Field of Search............................330/207 P; 307/202

[56] References Cited

UNITED STATES PATENTS

| | | | |
|---|---|---|---|
| 3,564,338 | 2/1971 | Teshirogi et al. | 330/207 P |
| 3,536,958 | 10/1970 | Sondermeyer | 330/207 P |
| 3,493,878 | 2/1970 | Fautale | 330/207 P |
| 3,408,589 | 10/1968 | Nishioka | 330/207 P |

*Primary Examiner*—Nathan Kaufman
*Attorney*—Darby & Darby

[57] ABSTRACT

A protection circuit for use with a transistor amplifier comprises a normally non-conductive transistor adapted to be connected across the input and output terminals of the output transistors of a power amplifier. An impedance network is coupled to the power amplifier so that it can derive voltages dependent upon the current flow in the emitter-collector circuit of the power amplifier and the emitter-collector voltage drop. These voltages are applied to the base of the protection transistor to drive it into conduction in the event either one of the signals, or the combination of both exceeds a predetermined limit. Thus, in the event of an overload (due, for example, to excessive load currents or overdriving the transistor), the drive signal is shunted from the power amplifier output stages. This action is analogous to a limiting action and prevents overload conditions from injuring or destroying the power amplifier.

1 Claim, 2 Drawing Figures

*INVENTOR.*
JOHN J. KLANATSKY
BY
*Darby & Darby*
ATTORNEYS

TRANSISTOR PROTECTION CIRCUIT

The present invention relates to protection circuits. More particularly, the present invention relates to a protection circuit intended to be used with a transistor power amplifier of the type which may be used to drive a loudspeaker in a high quality audio sound system.

Transistor amplifiers are particularly susceptible to overload conditions. They can be destroyed by excessive currents or voltage due, for example, to overloading (e.g. a short circuit) or excessive input signals.

Many different transistor protection circuits have been proposed. These have included mechanical or electrical devices which disconnect the transistor from the voltage source in the event that current through the transistor exceeds a predetermined level. On a more sophisticated level, it has been proposed to short-circuit the transistor input in the case of excessive input signals or when the output of the amplifier is overloaded (see, for example, Hafler Pat. No. 3,441,864).

The present invention provides a protection circuit for a transistor amplifier which is improved with respect to known types of similar circuits in that it continuously monitors both current and voltage conditions and limits power dissipation in the transistor to a safe level independent of the load powered by the amplifier.

Briefly, the invention includes a normally non-conductive shunt transistor having its emitter-collector circuit connected in parallel with the input of the transistor to be protected. Conduction of the shunt transistor is controlled by the current flow in the output transistor and the voltage across it. When the shunt transistor is caused to conduct, it provides a path for excess drive signal, thus preventing excessive dissipation in the output transistor. The shunt transistor is responsive to both voltage and current conditions, and the level at which it conducts may be dependent upon the load driven by the power amplifier.

The invention is described in further detail below with reference to the attached drawings wherein.

The preferred embodiment of the invention was designed specifically for use with an audio amplifier, although the invention may be employed with any amplifier configuration. Such audio amplifiers commonly comprise a pair of complementary-symmetry transistors connected in any of a number of different configurations. A typical push-pull configuration of an amplifier of this type is illustrated in pending application, Ser. No. 679,119 entitled "Power Amplifier with Overload Protection" filed on Oct. 30, 1967, and assigned to the assignee of this invention.

Figure 1:
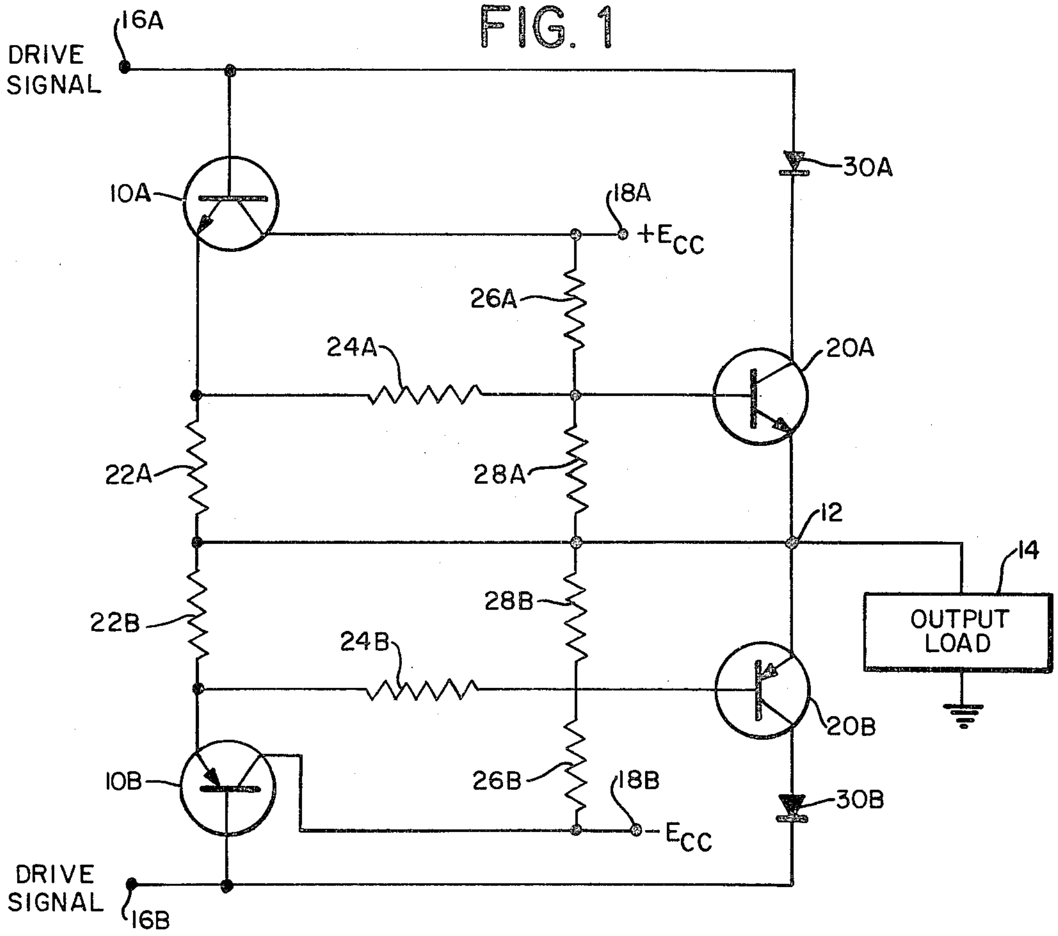
FIG. 1 is a circuit diagram of a preferred embodiment of the invention.

The two output stages of the amplifier are shown in FIG. 1 as transistors 10A and 10B. In the following description and in the drawing, the letters "A" and "B" are used to identify circuit components which affect the operation of one of the two stages of the amplifier. Since the two amplifier stages are identical, only the "A" side is described in detail. The correspondingly numbered parts of the "B" side operate in the same way.

The two amplifier output stages 10A and 10B have a common output terminal 12 to which a load 14 (for example, a loudspeaker) can be connected. The amplifier is driven by complementary drive signals (derived from respective driver stages) appearing at the illustrated terminals 16A and 16B and coupled to the bases of transistors 10A and 10B. The operating potential for these transistors is derived from the terminals 18A and 18B which have the polarities illustrated. In operation, the respective output stages 10A and 10B will feed opposite half-cycles of the input signal to the output terminal 12 and thus to the load 14.

The power output stages 10A and 10B are the transistors which must be protected in the event the output load 14 is short-circuited or the signals applied to the terminals 16A and 16B exceed a predetermined level. For this purpose, a pair of shunt transistors 20A and 20B are provided. Each is connected with its emitter-collector circuit in parallel with the input of its corresponding output stage 10A or 10B. The base of transistor 20A is connected to the output stage 10A by means of a resistive network which includes resistors 22A, 24A, 26A and 28A. Resistor 22A is in series with the emitter-collector circuit of output stage 10A and thus serves to monitor the current flow through the transistor. If current flow through the transistor 10A becomes excessive, the increased voltage drop across resistor 22A will bias transistor 20A into conduction, thus shunting the drive signals at terminal 16A directly to the output terminal 12. The values of resistors 24A, 26A and 28A are selected to determine the maximum current which can be sustained through transistor 10A prior to conduction of transistor 20A.

Resistor 26A, in conjunction with resistors 22A, 24A and 28A, monitors the voltage across the output stage 10A. Thus, if for some reason, the collector voltage on transistor 10A should increase considerably, transistor 20A will be biased into conduction to short out the input signal on terminal 16A to the output terminal 12.

Since the resistive network senses both current and voltage changes, transistor 20A is capable of responding to a current or a voltage change alone. However, it is evident that combined changes in current and voltage may also cause conduction of transistor 20A. Accordingly, the limiting action of the transistor 20A is dependent upon both current and voltage. Since the safe operating area of a transistor is dependent upon both of these parameters, the invention thus provides a more effective way of limiting transistor operation to the safe area.

Figure 2:
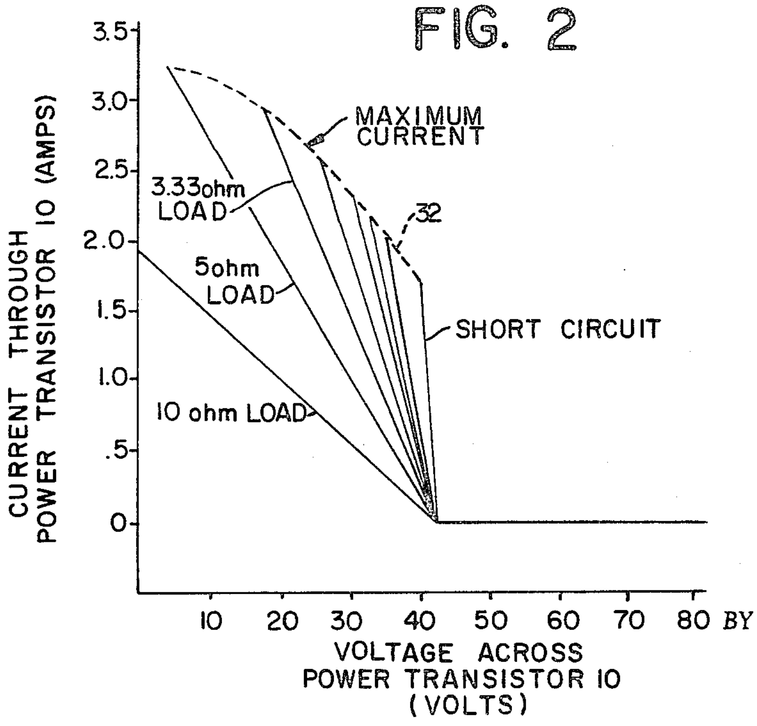
FIG. 2 is an illustration of different load lines showing the effect of the invention.

The foregoing is shown in FIG. 2 which is a load line diagram for a transistor amplifier under various load conditions. This diagram corresponds to measurements made with an operable embodiment of the invention.

With a 10-ohm load, there is no danger of the transistors 10A and 10B drawing excessive current. At a 5-ohm load, the current through the power output stage is limited to about 3.25 amps with a voltage drop of approximately 4 volts. With a 3.3-ohm load, the maximum current is approximately 3 amps with a voltage drop of about 20 volts across the transistor. The maximum current curve for different loads up to sand including a short circuit is shown by the dashed line 32.

A practical feature of the invention is the provision of diodes 30A and 30B in the emitter-collector circuits of the transistors 20A and 20B. These diodes prevent the forward biasing of the collector base junctions of their respective transistors 20A and 20B, which possibly could damage or destroy these transistors. These diodes are required in practice where instantaneous conditions may result in the forward biasing referred to.

What is claimed is:

1. A transistor protection circuit for use with a power amplifier having input terminals to which a drive signal can be coupled and a common output terminal to which a load can be connected, said power amplifier comprising a push-pull amplifier having two power amplifier stages comprising
   a. a normally non-conductive protection transistor associated with each said power amplifier stage, each protection transistor having its emitter-collector circuit connected between an input terminal for its associated power amplifier stage and said output terminal,
   b. a pair of diodes connected respectively to the collectors of each of said protection transistors for preventing forward biasing of the collector-base junctions thereof
   c. a pair of resistive networks associated with said power amplifier stages, respectively, each said resistive network including
      i. a first resistor series-connected in the emitter-collector circuit of its associated power amplifier stage for producing a voltage dependent upon the magnitude of current flowing in said emitter-collector circuit, and
      ii. three additional resistors, said additional resistors of each network having a common junction coupled to the base of the associated protection transistor, the other ends of two of said additional resistors being connected, respectively, to said collector and emitter of the associated power amplifier stage, and the other end of the third additional resistor being connected to said common output terminal, said three additional resistors of each network producing a voltage at said common junction primarily dependent upon the emitter-collector voltage across the associated power amplifier stage, the values of said resistors being selected so that the associated protection transistor is driven into conduction when the sum of the voltages at said common junction exceeds a predetermined level to thereby provide a shunt current path through the emitter-collector circuit of said protection transistor around its associated power amplifier stage.

* * * * *